United States Patent [19]

Passler

[11] 3,983,459
[45] Sept. 28, 1976

[54] CIRCUIT BOARD SPACER
[75] Inventor: Herbert E. Passler, Phoenix, Ariz.
[73] Assignee: Honeywell Information Systems, Inc., Waltham, Mass.
[22] Filed: July 2, 1975
[21] Appl. No.: 592,567

[52] U.S. Cl. .......................... 317/101 DH; 211/41
[51] Int. Cl.² .......................................... H02B 1/02
[58] Field of Search ................ 317/101 DH; 211/41

[56] References Cited
UNITED STATES PATENTS
3,476,983  11/1969  Roberts ....................... 317/101 DH Primary Examiner—David Smith, Jr.
Attorney, Agent, or Firm—W. W. Holloway, Jr.; E. W. Hughes

[57] ABSTRACT

A circuit board spacer is provided for maintaining two relatively flexible circuit boards overlying one another in a circuit board rack in mechanical isolation from each other. The circuit board spacer comprises a roller formed of a plurality of thin, tough, contiguous, flexible disks on a common axle and a support member for securing the roller to the central portion of one of the circuit boards. When one circuit board is inserted into the circuit board rack containing the other circuit board, the roller rides through the ends of leads or terminal pins protruding from the other circuit board, as the roller disks allow complete penetration of the roller by the leads or pins. As a result, the circuit boards, and any portions thereof, are prevented from contacting one another in such a manner as would cause physical damage to the circuit boards or compromise the electrical circuitry thereon.

6 Claims, 5 Drawing Figures

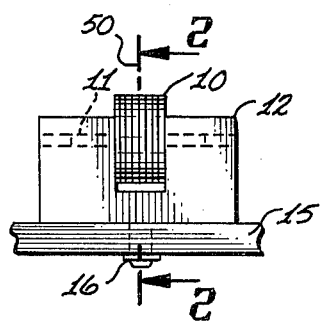
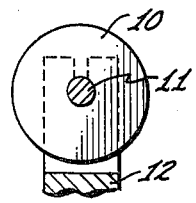
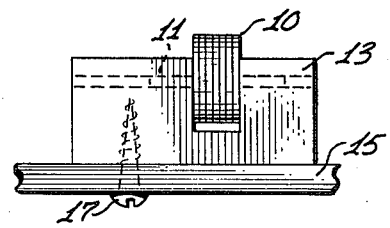
Fig. 1  Fig. 2  Fig. 3
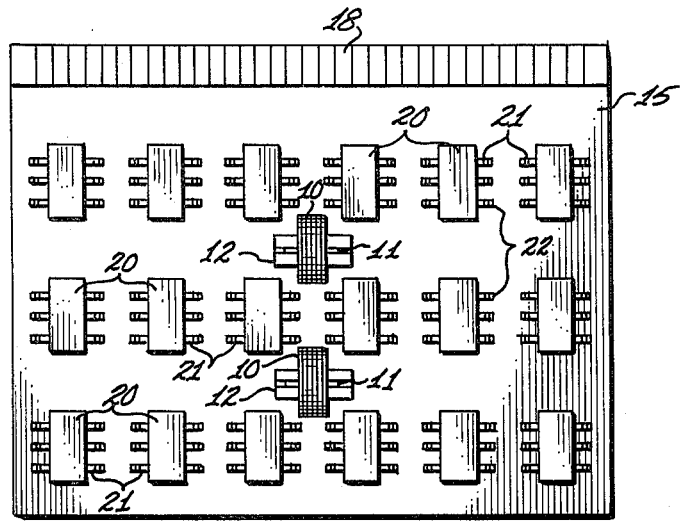
Fig. 4
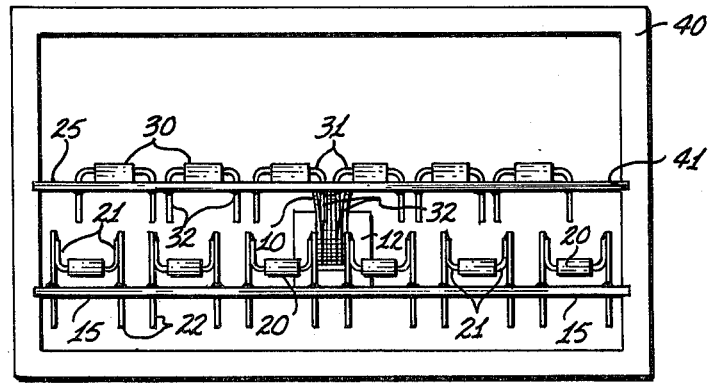
Fig. 5

CIRCUIT BOARD SPACER

BACKGROUND OF THE INVENTION

This invention relates generally to the packaging of electronic devices and, in particular, to a circuit board spacer for maintaining two relatively flexible circuit boards in a circuit board rack in physical isolation from one another.

In the art of packaging and interconnecting electronic devices, there is a notable trend towards high density packaging. In the digital computer technology, for example, it has been found desirable to package electronic devices as closely together as possible in order to increase the operational efficiency of the overall data processing system.

A common packaging arrangement throughout the electronics industry is the placement of electronic devices on printed circuit boards. Often a plurality of circuit boards are stacked one above the other in a circuit board rack to achieve higher packaging density. The spacing between adjacent circuit boards is a critical factor, since on the one hand it is highly desirable to position adjacent boards as closely as possible to achieve the benefit of high density packaging and on the other hand adjacent boards must not be permitted to come into physical contact with one another. Physical contact between adjacent boards or the components or lead projections thereof can result in damage to the boards or their components when circuit boards are inserted or removed from the circuit board rack. Also, physical contact between the boards or their components ordinarily results in electrical contact as well, which violates the electrical integrity of the circuitry on the boards and results in decreased electrical performance, burned circuit boards, or blown out circuit breakers.

The use of large, highly populated, relatively flexible circuit boards, as is common in the digital computer industry, substantially increases the changes of adjacent boards making physical contact with one another, since after a period of time circuit boards which are suspended by their edges have a marked tendency to sag in the middle, thereby coming into contact with another board. The high density packaging of these boards, in the form of a great many electronic devices per board, increases the probability of board sag. The tendency of operational electronic equipment to vibrate also increases the opportunity for board contact.

A variety of circuit board spacers are known in the prior art in the form of spacer pins, sliders, brushes, and rubber rollers; however, they have been found to be unsatisfactory because of their tendency to snag and damage board components or to be subject to excessive wear and rapid deterioration.

A satisfactory circuit board spacer must address itself to several specific problems. First, it should be constructed of an electrically insulating material to prevent shorting between adjacent circuit boards. Secondly, it should permit relatively easy insertion and removal of circuit boards. It should also be relatively long-wearing, and preferably have a life-time equal to or exceeding that of the board itself. Lastly, it should be relatively simple in construction and low in cost. The present invention is directed to a novel circuit board spacer which satisfies these requirements.

SUMMARY OF THE INVENTION

It is therefore an object of the present invention to provide an improved circuit board spacer.

It is also an object of the present invention to provide a circuit board spacer of relatively simple construction which is highly effective in operation.

These and other objects of the present invention are achieved in accordance with a preferred embodiment of the invention by providng a circuit board spacer comprising a roller formed of a plurality of thin, tough, contiguous, flexible disks of an insulating material moving about a common axle and a support member for securing the roller to the central portion of a circuit board. According to a preferred embodiment, two such spacers are mounted in the central portion of a circuit board so that the roller axles are parallel to the plane of the circuit board and perpendicular to the direction of insertion and removal of the circuit board from the circuit board rack.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 1 shows a side view representation of a preferred embodiment of the circuit board spacer of the present invention.

FIG. 2 shows a representation of the roller portion of the present invention, in the form of a cross-section taken along line 50 of FIG. 1.

FIG. 3 shows a side representation of another embodiment of the circuit board spacer of the present invention.

FIG. 4 shows a top view of a circuit board upon which are mounted two circuit board spacers according to a preferred embodiment of the present invention.

FIG. 5 shows a side representation of a circuit board rack containing two circuit boards, one of which has mounted thereon a circuit board spacer of the present invention.

DETAILED DESCRIPTION OF THE INVENTION

FIG. 1 shows a representational side view of the circuit board spacer according to a preferred embodiment of the present invention, including roller 10, roller shaft or axle 11, roller support member or yoke 12, and securing means 16 for attaching the circuit board spacer to circuit board 15. Roller 10, shown in cross-section in FIG. 2, comprises a plurality of tough, thin, contiguous, flexible disks of an insulating material rotating about a common axle 11. In a preferred embodiment, fifteen to twenty individual disks each approximately 0.5 inches in diameter are utilized. The disks may be formed of any suitably electrically insulating material. Mylar (a U.S. trademark) of approximately 10 mils thickness side by side on axle 11, moderately close together so that they form a continuous roller surface.

The roller support 12 may be formed of molded plastic. The attaching means 16 may be any suitable means for mechanically securing the circuit board spacer to the surface of circuit board 15. Axle 11 may be snap fitted into a channel designed to receive it in the top portion of support 12 (refer to FIG. 4).

Referring now to FIG. 3, which is a side representation of another embodiment of the circuit board spacer of the present invention, one side of support member 12 has been made wider than the other side in order to accommodate the point of a self-tapping plastic screw 17 for securing the circuit board spacer to circuit board 15. The embodiment shown in FIG. 3 has utility where the circuit board spacer is to be secured to a circuit board 15 at the location of pre-existing holes in circuit board 15. Roller 10 is shown offset from screw 17 by a suitable distance such that roller 10 will be aligned with one or more rows of leads protruding from the circuit board mounted above it (see FIG. 5 wherein the roller 10 of the embodiment shown in FIG. 1 is aligned with a double row of protruding lead portions 32).

FIG. 4 shows a top view of a circuit board 15 upon which are mounted a pair of circuit board spacers according to a preferred embodiment of the present invention. Along one edge of circuit board 15 is a row of signal, power, and ground terminals 18. Mounted to terminal pins 22 extending through circuit board 15 are a plurality of electronic devices 20 having leads 21. Devices 20 are mounted in the so-called "dead bug" configuration, in which the leads 21 are bent upwards from the surface of board 15 and soldered to the terminal pins 22 extending through board 15. The circuit board spacers are mounted approximately in the center of circuit board 15 where they will be most effective in preventing physical contact with board 15 by a sagging circuit board mounted above circuit board 15.

FIG. 5 shows a side representation of a circuit board rack 40 in which are mounted a pair of circuit boards 15 and 25. The representation of FIG. 5 is not drawn to scale but rather is purposely distorted to show the operation of the circuit board spacer in maintaining a predetermined separation between circuit boards 15 and 25. In actuality, circuit boards 15 and 25 would be much larger and have many electronic components mounted on them, and circuit boards 15 and 25 would be spaced so closely together that the downwardly extending lead terminal portions 32 from circuit board 25 would almost touch the upwardly extending leads or terminal pins 22 of circuit board 15. It will also be understood that many more circuit boards are commonly mounted in a circuit board rack than the two shown in FIG. 5.

The electronic components 30 mounted on circuit board 25 are in the so-called "live bug" configuration, in which the component leads 31 extend downward into plated-through holes in the board 25. Other wires and components (not shown) may provide electrical interconnections between the electronic components 30 by being connected between the downwardly extending terminal portions 32 of leads 31.

In FIG. 3 a circuit board spacer is shown mounted on circuit board 15 so that its roller 10 is in alignment with a double line of lead terminal portions 32 extending downwardly from the surface of circuit board 25. The roller support 12 and the diameter of roller 10 are of sufficient dimensions that circuit board 25 is spaced from and maintained substantially co-planar with circuit board 15. When either circuit board 15 or circuit board 25 is moved relative to the other circuit board, the downwardly projecting lead portions 32 of circuit board 25 actually penetrate completely between the adjacent disks of roller 10. Because the sharp lead ends 32 are permitted to slip between the rotating disks of roller 10 it has been found that roller life is greatly increased as opposed to the case where a solid roller 10 of rubber or similar substance is used.

It will be apparent to those skilled in the art that the disclosed Circuit Board Spacer may be modified in numerous ways and may assume many embodiments other than the preferred embodiment specifically set out and described above. For example, more than one roller may be utilized in conjunction with one roller support means. Further, any number of circuit board spacers may be used on one or both sides of the circuit board, as necessary, to prevent physical contact between adjacent circuit boards.

Accordingly, it is intended by the appended claims to cover all modifications of the invention which fall within the true spirit and scope of the invention.

What is claimed is:

1. A circuit board spacer for maintaining two relatively flexible circuit boards, one overlying the other in a circuit board rack, in physical isolation from one another, said spacer comprising
a roller formed of a plurality of relatively thin, tough, closely spaced concentric disks mounted on a common shaft, said disks being formed of an electrically insulating material, and
support means for said roller, said support means including means for securing said roller to a first one of said circuit boards in such an orientation that the shaft of said roller is parallel to the plane of said first circuit board and perpendicular to the direction in which said circuit boards are inserted and removed from said circuit board rack, the distance from the surface of said first circuit board to the outermost portion of said roller being sufficient to space said circuit boards to prevent physical contact between said boards or any portions thereof.

2. The circuit board spacer of claim 1 wherein said electrically insulating material is Mylar.

3. The circuit board spacer of claim 1 wherein at least one of said circuit boards has one or more protuberances extending from it in the direction of the other circuit board.

4. The circuit board spacer of claim 3 wherein said electrically insulating material is Mylar.

5. The circuit board spacer of claim 1 wherein the second of said circuit boards has a plurality of wires of substantially uniform length extending from it in the direction of said first circuit board, said plurality of wires comprising at least one row arranged along the direction of movement of said roller so that when one of said circuit boards is moved relative to the other the disks of said roller permit the ends of said wires to penetrate between them as said roller rotates.

6. The circuit board spacer of claim 5 wherein said electrically insulating material is Mylar.

* * * * *